(12) United States Patent
Zhao et al.

(10) Patent No.: US 11,031,578 B2
(45) Date of Patent: Jun. 8, 2021

(54) DISPLAY SUBSTRATE AND MANUFACTURING METHOD THEREOF

(71) Applicant: BOE TECHNOLOGY GROUP CO., LTD., Beijing (CN)

(72) Inventors: Dejiang Zhao, Beijing (CN); Yimin Chen, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 495 days.

(21) Appl. No.: 15/775,888

(22) PCT Filed: Sep. 18, 2017

(86) PCT No.: PCT/CN2017/102042
§ 371 (c)(1),
(2) Date: May 14, 2018

(87) PCT Pub. No.: WO2018/157579
PCT Pub. Date: Sep. 7, 2018

(65) Prior Publication Data
US 2020/0303686 A1    Sep. 24, 2020

(30) Foreign Application Priority Data

Mar. 3, 2017 (CN) .......................... 201710124200.1

(51) Int. Cl.
*H01L 51/56* (2006.01)
*H01L 27/32* (2006.01)
*H01L 51/00* (2006.01)

(52) U.S. Cl.
CPC ............ *H01L 51/56* (2013.01); *H01L 27/326* (2013.01); *H01L 27/3223* (2013.01);
(Continued)

(58) Field of Classification Search
CPC .......... H01L 27/3223; H01L 27/32586; H01L 27/326; H01L 51/0005; H01L 2251/50
See application file for complete search history.

(56) References Cited

U.S. PATENT DOCUMENTS 7,300,686 B2 * 11/2007 Morii .................. H01L 51/0005
427/421.1
8,507,897 B2 * 8/2013 Yanagihara ......... H01L 27/3246
257/40
(Continued)

FOREIGN PATENT DOCUMENTS

CN        1662112 A      8/2005
CN        101796561 A    8/2010
(Continued)

OTHER PUBLICATIONS

First Office Action for CN Appl. No. 201710124200.1, dated Feb. 11, 2019.
(Continued)

*Primary Examiner* — David A Zarneke
(74) *Attorney, Agent, or Firm* — Dinsmore & Shohl LLP (57) ABSTRACT

The present disclosure discloses a display substrate and a manufacturing thereof. The display substrate comprises a base substrate, a pixel defining layer formed on the base substrate, wherein the pixel defining layer is provided with an opening region comprising a bottom wall and at least one sidewall, wherein in the opening region, an edge of the bottom wall is provided with at least one hydrophilic inducing column, wherein at least one of the hydrophilic inducing column has a hydrophilic surface.

20 Claims, 4 Drawing Sheets

(52) U.S. Cl.
CPC ...... *H01L 27/3246* (2013.01); *H01L 27/3283* (2013.01); *H01L 51/0005* (2013.01); *H01L 2251/50* (2013.01)

(56) References Cited

U.S. PATENT DOCUMENTS

| | | |
|---|---|---|
| 9,213,180 B2 | 12/2015 | Choi et al. |
| 9,786,382 B1* | 10/2017 | Matsumoto ............ G11C 17/16 |
| 10,879,322 B2* | 12/2020 | Hou ................... H01L 51/5088 |
| 2005/0140265 A1* | 6/2005 | Hirakata ............. H01L 51/5259 |
| | | 313/483 |
| 2006/0273716 A1* | 12/2006 | Uhlig ................... H01L 51/0005 |
| | | 313/506 |
| 2010/0108880 A1* | 5/2010 | Stoermer ............ H01J 49/0072 |
| | | 250/283 |
| 2011/0227100 A1* | 9/2011 | Kurihara ............. H01L 27/3283 |
| | | 257/88 |
| 2012/0181553 A1* | 7/2012 | Ono ....................... H05B 33/22 |
| | | 257/88 |
| 2019/0096970 A1* | 3/2019 | Hou ................... H01L 27/3211 |

FOREIGN PATENT DOCUMENTS

| | | |
|---|---|---|
| CN | 102969333 A | 3/2013 |
| CN | 104167430 A | 11/2014 |
| CN | 106783939 A | 5/2017 |
| JP | 2007-311236 A | 11/2007 |

OTHER PUBLICATIONS

International Search Report and Written Opinion, dated Dec. 27, 2017, issued in corresponding International Application No. PCT/CN2017/102042.

* cited by examiner

DISPLAY SUBSTRATE AND MANUFACTURING METHOD THEREOF

CROSS-REFERENCE TO RELATED APPLICATIONS

This application is a U.S. National Stage under 35 U.S.C. § 371 of International Application No. PCT/CN2017/102042, filed on Sep. 18, 2017, which claims the benefit of and priority to Chinese Patent Application No. 201710124200.1, filed on Mar. 3, 2017, which is hereby incorporated by reference in its entirety as a part of the present application.

TECHNICAL FIELD

The present disclosure relates to an display substrate and a manufacturing method thereof.

BACKGROUND

Organic light-emitting Diode (OLED) display technology is a technology that uses reversible discoloration generated by organic functional materials when driven by a current, for display. At present, a common method of manufacturing an organic functional material layer in an OLED display device is to use an ink jet printing method. The use of the ink jet printing method to manufacture OLED products has advantages such as high productivity and low material cost, but the method is restricted by the own characteristics of the printing technology, and is difficult for fabricating high precision products.

SUMMARY

Embodiments of the present disclosure provide an display substrate comprising a base substrate, a pixel defining layer formed on the base substrate, wherein the pixel defining layer is provided with an opening region comprising a bottom wall and at least one sidewall, wherein in the opening region, an edge of the bottom wall is provided with at least one hydrophilic inducing column, wherein at least one of the hydrophilic inducing column has a hydrophilic surface.

In an example, a plurality of hydrophilic inducing columns are provided, the bottom wall is of a regular shape, and the plurality of hydrophilic inducing columns are provided symmetrically with respect to at least one symmetrical axis or a center of symmetry of the bottom wall.

In an example, the opening region has a plurality of sidewalls, a plurality of hydrophilic inducing columns are provided, the bottom wall has at least three sides connected by arcs at corners of the bottom wall, each corner of the bottom wall is provided with a respective one of the plurality of hydrophilic inducing columns.

In an example, the opening region has four sidewalls, a plurality of hydrophilic inducing columns are provided, the bottom wall has four sides connected by arcs at corners of the bottom wall, each corner of the bottom wall is provided with a respective one of the plurality of hydrophilic inducing columns.

In an example, the at least one hydrophilic inducing column is of the same height as the opening region.

In an example, the at least one hydrophilic inducing column has a hydrophilicity greater than a hydrophilicity of the bottom wall.

In an example, at least one hydrophobic inducing column is provided on an upper surface of the pixel defining layer near the at least one sidewall, wherein at least one of the hydrophobic inducing column has a hydrophobic surface.

In an example, a plurality of hydrophobic inducing columns are provided, a region bounded by a boundary of the upper surface of the pixel defining layer with the at least one sidewall is of a regular shape, and the plurality of hydrophilic inducing columns are provided symmetrically with respect to at least one symmetrical axis or a center of symmetry of the region.

In an example, the opening region has a plurality of sidewalls, a plurality of hydrophobic inducing columns are provided, and a respective one of the plurality of hydrophobic inducing column is provided on the upper surface of the pixel defining layer near a respective corner of the plurality of sidewalls.

In an example, the opening region has four sidewalls, a plurality of hydrophobic inducing columns are provided, and a respective one of the plurality of hydrophobic inducing columns is provided on the upper surface of the pixel defining layer near a respective corner of the four sidewalls.

In an example, a height of the at least one hydrophobic inducing column is greater than a thickness of the pixel defining layer.

In an example, a plurality of hydrophobic inducing columns are provided, and the plurality of hydrophobic inducing columns are of the same height.

The embodiments of the present disclosure further provide a method of manufacturing an display substrate comprising:
providing a base substrate;
forming a pixel defining layer on the base substrate;
forming in the pixel defining layer an opening region comprising a bottom wall and at least one sidewall;
forming, in the opening region, at least one hydrophilic inducing column at an edge of the bottom wall, wherein at least one of the hydrophilic inducing column has a hydrophilic surface.

In an example, a plurality of hydrophilic inducing columns are formed, the bottom wall is of a regular shape, and forming, in the opening region, at least one hydrophilic inducing column at an edge of the bottom wall comprises forming the plurality of hydrophilic inducing column symmetrically with respect to at least one symmetrical axis or a center of symmetry of the bottom wall.

In an example, the opening region has a plurality of sidewalls, a plurality of hydrophilic inducing columns are provided, and the bottom wall has at least three sides connected by arcs at corners of the bottom wall, and forming, in the opening region, at least one hydrophilic inducing column at an edge of the bottom wall comprises a respective one of the plurality of hydrophilic inducing columns at each corner of the bottom wall.

In an example, a plurality of hydrophilic inducing columns are formed, the opening region has four sidewalls, the bottom wall has four sides connected by arcs at corners of the bottom wall, and forming, in the opening region, at least one hydrophilic inducing column at an edge of the bottom wall comprises forming a respective one of the plurality of hydrophilic inducing columns at each corner of the bottom wall.

In an example, the method further comprises forming at least one hydrophobic inducing column on an upper surface of the pixel defining layer near the at least one sidewall, wherein at least one of the hydrophobic inducing column has with a hydrophobic surface.

In an example, a plurality of hydrophobic inducing columns are formed, a region bounded by a boundary of the upper surface of the pixel defining layer with the at least one sidewall is of a regular shape, and forming at least one hydrophobic inducing column on an upper surface of the pixel defining layer near the at least one sidewall comprises forming the plurality of hydrophobic inducing columns symmetrically with respect to at least one symmetrical axis or a center of symmetry of the region.

In an example, the opening region has four sidewalls, a plurality of hydrophobic inducing columns are formed, and forming at least one hydrophobic inducing column on an upper surface of the pixel defining layer near the at least one sidewall comprises forming a respective one of the plurality of hydrophobic inducing column on the upper surface of the pixel defining layer near a respective corner of the plurality of sidewalls.

In an example, the opening region has four sidewalls, a plurality of hydrophobic inducing columns are formed, and forming at least one hydrophobic inducing column on an upper surface of the pixel defining layer near the at least one sidewall comprises forming a respective one of the plurality of hydrophobic inducing columns on the upper surface of the pixel defining layer near a respective corner of the four sidewalls.

The other features and advantages of the present disclosure will be described in the subsequent specification, and, in part, become obvious from the specification, or be understood by the carrying out the disclosure. The purpose and other advantages of the present disclosure may be achieved and obtained by means of the structure specifically indicated in the description, the claims and the accompanying drawings.

BRIEF DESCRIPTION OF THE DRAWINGS

The drawings are used to provide a further understanding of the technical solutions of the present disclosure, constitute a part of the specification, and are used for explaining the technical solutions of the present disclosure along with the embodiments of the present application, but do not constitute limitations to the technical solutions of the present disclosure.

DETAILED DESCRIPTION

In order to make the objectives, technical solutions, and advantages of the present disclosure clearer and more comprehensible, the embodiments of the present disclosure are described in detail in the following with reference to the accompanying drawings. It should be noted that, if, without conflicts, the embodiments of the present application and the features in the embodiments can be arbitrarily combined with each other.

The steps shown in the flowcharts of the drawings can be executed in a computer system such as a set of computer executable instructions. Also, although the logical order is shown in the flowchart, in some cases, the steps shown or described can be executed in a different order.

It should be noted that, while the following embodiments take the OLED display device as an example to illustrate the disclosure, as can be appreciated by those skilled in the art, the present disclosure can be applied to any display device capable of fabricating a functional layer by using an inkjet printing method, but is not limited to the OLED display device.

Embodiments of the present disclosure provide an display substrate and a manufacturing method thereof, which is capable of improving uniformity of film formation and increasing the effective area of the light-emitting region.

Embodiments of the present disclosure provide an display substrate comprising a base substrate, a pixel defining layer on the base substrate, wherein the pixel defining layer is provided with an opening region comprising a bottom wall and at least one sidewall, wherein in the opening region, an edge of the bottom wall is provided with at least one hydrophilic inducing column, wherein at least one of the hydrophilic inducing column has a hydrophilic surface.

The edge of the bottom wall is a position near a boundary of the bottom wall with the at least one sidewall, the at least one hydrophilic inducing column can be in close proximity to the boundary of the bottom wall with the at least one sidewall, or can be in a slight distance from the boundary.

In an example, a plurality of hydrophilic inducing columns are provided, the bottom wall is of a regular shape, and the plurality of hydrophilic inducing columns are provided symmetrically with respect to at least one symmetrical axis or a center of symmetry of the bottom wall.

Specifically, the positions of the plurality of hydrophilic inducing columns satisfy the following relation: for a first position provided with a respective one of the plurality of hydrophilic inducing columns, a second position and a third position symmetrically with the first position are provided with respective ones of the hydrophilic inducing columns, wherein the symmetry is based on a symmetrical axis or a center of symmetry of the bottom wall. That is, a position symmetrical with the position where each hydrophilic inducing column lies is provided with another hydrophilic inducing column. In a special case, for example, when the first position is in the middle of two corners of the bottom wall, the third position is the same with the first position.

In an example, the opening region has a plurality of sidewalls, a plurality of hydrophilic inducing columns are provided, the bottom wall has at least three sides connected by arcs at corners of the bottom wall, each corner of the bottom wall is provided with a respective one of the plurality of hydrophilic inducing columns.

In an alternative embodiment of the present disclosure, at least one hydrophobic inducing column is provided on an upper surface of the pixel defining layer near the at least one sidewall, wherein at least one of the hydrophobic inducing column has a hydrophobic surface.

In an example, a plurality of hydrophobic inducing columns are provided, a region bounded by a boundary of the upper surface of the pixel defining layer with the at least one sidewall is of a regular shape, and the plurality of hydrophilic inducing column are provided symmetrically with respect to at least one symmetrical axis or a center of symmetry of the region.

Specifically, for a fourth position provided with a respective one of the plurality of hydrophobic inducing columns, a fifth position and a sixth position symmetrically with the fourth position are provided with respective ones of the plurality of hydrophobic inducing columns, wherein the symmetry is based on a symmetrical axis or a center of symmetry of the region bounded by the boundary of the upper surface of the pixel defining layer with the sidewall. That is, a hydrophobic inducing column is provided at a position symmetrical with the position where each of the hydrophobic inducing columns lies.

In an example, the opening region has a plurality of sidewalls, a plurality of hydrophobic inducing columns are provided, and a respective one of the plurality of the hydrophobic inducing column is provided on the upper surface of the pixel defining layer near a respective corner of the plurality of sidewalls.

The present disclosure is further described below according to a specific example.

Figure 1:
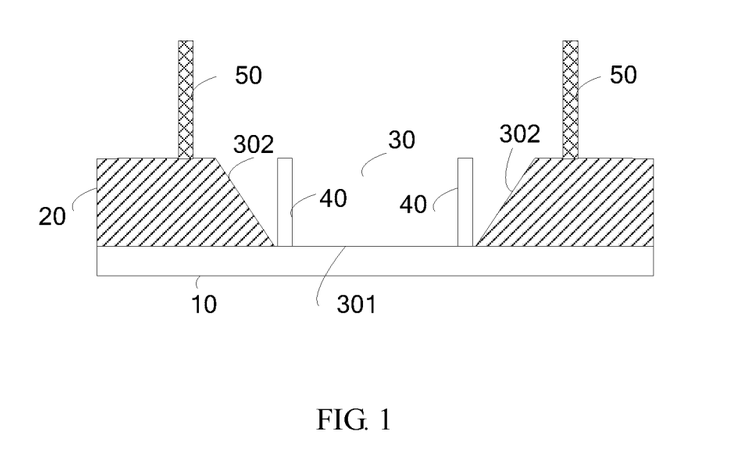
FIG. 1 is a sectional view of an display substrate provided according to an embodiment of the present disclosure.
Figure 2:
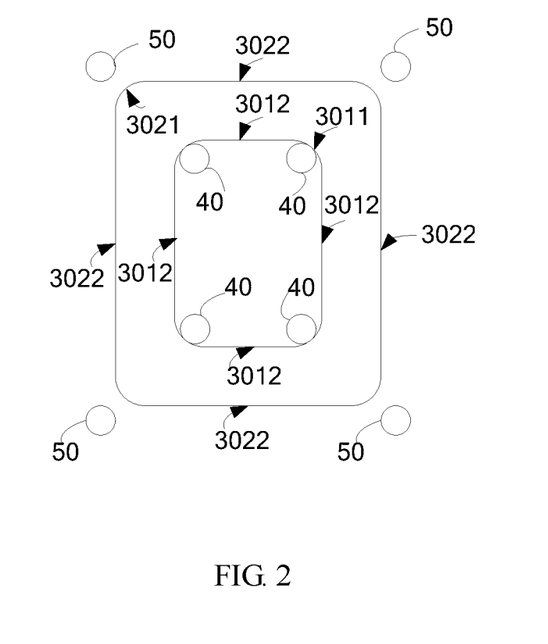
FIG. 2 is a top view of an display substrate provided according to an embodiment of the present disclosure.

FIG. 1 is a sectional view of an display substrate provided according to an embodiment of the present disclosure; and FIG. 2 is a top view of an display substrate provided according to an embodiment of the present disclosure. As shown in FIGS. 1 and 2, an display substrate provided according to an embodiment of the present disclosure comprises a base substrate 10, a pixel defining layer (PDL layer, or referred to as bank layer) 20 on the base substrate 10, wherein the pixel defining layer is provided with an opening region 30 comprising a bottom wall 301 and at least one sidewall 302, wherein in the opening region 30, each corner 3011 of the bottom wall 301 is provided with a hydrophilic inducing column 40 with a hydrophilic surface. The bottom wall 301 and the sidewall 302 form a cavity to contain ink to be injected. It should be noted that, the opening region 30 exposes an anode layer, that is, the bottom wall 301 of the opening region 30 is an anode layer. The hydrophilic inducing column 40 is within the opening region 30. Generally, the hydrophilic inducing column 40 is perpendicular to the bottom wall.

As can be seen from FIG. 2, the bottom wall 301 has four corners 3011, and a hydrophilic inducing column 40 can be formed at each corner 3011, thus in total four hydrophilic inducing columns 40 are formed. The hydrophilic inducing column 40 has a function to counteract tension of the ink. The hydrophilic inducing column can be in close proximity to the boundary 3012 of the bottom wall 301, or can be in a slight distance from the boundary 3012. In an example, positions of these four hydrophilic inducing columns are symmetrical. The symmetry is based on the symmetrical axis of the bottom wall 301, including left and right symmetry and up and down symmetry.

The hydrophilic inducing column 40 can be of a cylindrical shape shown in FIGS. 1 and 2, or other shapes such as square column or prismatic column.

The shape of the opening region 30 (or the shape of the bottom wall 301) can be of a rectangular shape shown in FIGS. 1 and 2, or other shapes such as a rectangle, a square, a trapezoid, a circle, an ellipse, or other regular or non-regular shapes.

The opening region 30 may have a plurality of sidewalls (such as 4 in FIGS. 1 and 2), or merely one sidewall (e.g., one continuous sidewall).

The hydrophilic inducing column 40 may adopt an organic hydrophilic material or an inorganic hydrophilic material, and its surface hydrophilicity is greater than a hydrophilicity of the bottom wall, but a difference with the hydrophilicity of the bottom wall is less than a set threshold to form a pull and drag with the bottom wall, to thereby counteract the surface tension of the ink.

In an alternative embodiment of the disclosure, the hydrophilic inducing columns 40 are of equal height.

In an alternative embodiment of the disclosure, the hydrophilic inducing column 40 is of the same height with the opening region. Of course, the hydrophilic inducing column 40 may also be slightly higher than the opening region.

Figure 3:
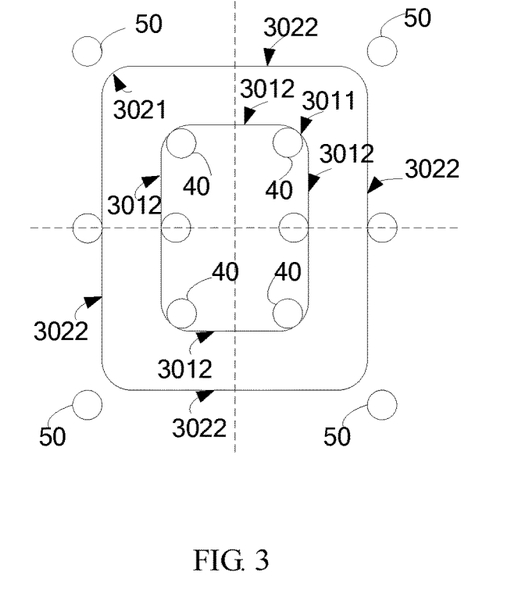
FIG. 3 is a top view of an display substrate provided according to another embodiment of the present disclosure.
Figure 4:
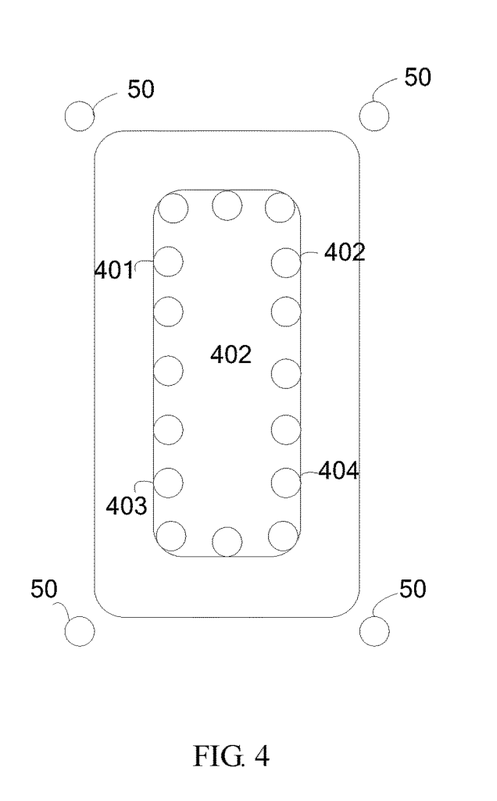
FIG. 4 is a top view of an display substrate provided according to a further embodiment of the present disclosure.

In an alternative embodiment of the disclosure, more hydrophilic inducing columns may be formed as needed. As shown in FIG. 3, the hydrophilic inducing column 40 is formed between two corners of the bottom wall 301 near the sidewall 302, and the hydrophilic inducing column 40 is formed at a symmetrical position of each hydrophilic inducing column 40, wherein the symmetry axis is based on the symmetric axis of the bottom wall as shown by a dashed line in FIG. 3. In FIG. 3, the position of the bottom wall 301 near the sidewall 302 is a position near the boundary 3012 of the bottom wall 301 with the sidewall 302. In FIG. 3, a hydrophilic inducing column 40 is formed at the middle position near the boundary 3012, and a hydrophilic inducing column 40 is also formed at the symmetrical position of the hydrophilic inducing column 40. FIG. 3 only shows hydrophilic inducing columns 40 formed at the middle positions near the left and right boundaries. In other embodiments of the present disclosure, a hydrophilic inducing column can be formed at the middle position near the upper boundary of the bottom wall 301 with the sidewall in FIG. 3, and a hydrophilic inducing column can be formed at the middle position near the lower boundary of the base wall 301 with the sidewall 302. In addition, a plurality of hydrophilic inducing columns can be formed at the position near the boundary 3012 on the bottom wall 301. For example, as shown in FIG. 4, a hydrophilic inducing column 401 is formed every 25 μm when the pixel size is 50 μm*150 μm. At this time, for the hydrophilic inducing column 401, it has two symmetrical positions, respectively provided with the hydrophilic inducing column 402 and the hydrophilic inducing column 403. For another hydrophilic inducing column 402, it has two symmetrical positions, respectively provided with the hydrophilic inducing column 401 and hydrophilic inducing column 404.

It should be noted that, the number of hydrophilic inducing columns can be set as needed, for example according to pixel size and ink characteristics.

In the solution of adding hydrophilic inducing columns in the opening region as provided by the embodiment of the disclosure, after injecting the ink in the opening region, ink dries gradually, and when the remaining ink volume is level with the pixel defining layer height, the hydrophilic inducing column begins to function to counteract the surface tension of ink droplets, so that the upper surface of the ink droplets is more flat, thereby improving uniformity of film formation.

When it is wanted to print a high resolution product, the size of the pixel becomes very small, the pixel can hold less and less ink volume, but the fabrication of the display device will use a comparatively large ink volume. If purely depending on increasing the height of the bank layer, although it can increase the ink volume, it will bring great difficulties to the evaporation of the cathode. A solution is provided in the embodiment of the disclosure. As shown in FIGS. 1 and 2, a hydrophobic inducing column 50 with a hydrophobic surface is formed at the corner 3021 on the upper surface of the pixel defining layer 20 near the sidewall 302. The hydrophobic inducing column 50 may adopt a fluorine-containing material. In the process of producing the same, by taking the connection with the pixel defining layer into consideration, the interface needs certain processing, for example, using UV irradiation, CF4 plasma processing, etc. The hydrophobic inducing column 50 is located on the upper surface of the pixel defining layer 20, and generally, the direction of the hydrophobic inducing column 50 is perpendicular to the pixel defining layer 20. As shown in FIG. 2, four hydrophobic inducing columns 50 are provided. In an example, positions of these four hydrophobic inducing columns 50 are symmetrical. The symmetry is based on the symmetric axis of the region formed by the boundary 3022 of the sidewall 302 with the pixel defining layer 20, including left and right symmetry and up and down symmetry.

In an alternative embodiment of the disclosure, the hydrophobic inducing columns 50 are of the same height and are higher than the height of the pixel defining layer 20. An optional range for the height of the hydrophobic inducing column 50 is: between ⅔-⅘ of the highest ink height after ink is injected into the opening region.

In an alternative embodiment of the disclosure, more hydrophobic inducing columns may be formed as needed. As shown in FIG. 3, a hydrophobic inducing column 50 is provided at the position between the two corners on the upper surface of the pixel defining layer 20 near the sidewall, and the hydrophobic inducing column is provided at the symmetrical position of each hydrophobic inducing column 50, wherein the symmetry is based on a symmetric axis of the region bounded by the boundary 3022 of the upper surface of the pixel defining layer with the sidewall, as shown in the dashed line in FIG. 3. The hydrophobic inducing column 50 is formed at a position between the two corners on the upper surface of the pixel defining layer 20 near the sidewall, that is, the hydrophobic inducing column is formed at the position near the boundary 3022 on the pixel defining layer but not at the corner 3021. In FIG. 3, a hydrophobic inducing column 50 is formed at the middle position near the boundary 3022, and a hydrophobic inducing column 50 is also formed at the symmetrical position of the hydrophobic inducing column 50. FIG. 3 only shows hydrophobic inducing columns 50 formed at the middle positions near the left and right boundaries. In other embodiments of the present disclosure, hydrophobic inducing columns 50 can also be formed at the middle positions near the upper and lower boundaries. In addition, a plurality of hydrophilic inducing columns can be formed at positions near the boundary 3022 on the upper surface of the pixel defining layer 20. For example, when the pixel size is 50 μm*150 μm, a hydrophobic inducing column 50 is formed every 20 μm, around the boundary of the sidewall with the upper surface of the pixel defining layer (i.e., around the boundary of the opening region with the upper surface of the pixel defining layer). The number of hydrophobic inducing columns can be set as needed, for example according to the pixel size and ink characteristics.

In the solution of adding hydrophobic inducing columns as provided by the embodiment of the disclosure, since hydrophobic inducing columns are added in the pixel outer layer, more inks are held and the demand of high resolution pixels on the ink volume is satisfied; meanwhile, since the hydrophobic inducing columns are separate, they will not affect the fabrication of the cathode, and the accumulation of materials near the hydrophobic inducing columns will act as an auxiliary electrode.

It should be noted that, the solution described in the embodiment of the disclosure is not limited to the opening region of the shape shown in the FIGS. 1 and 2, and the opening region of other shapes may also apply to the solution described in the disclosure.

The implementation of the solution provided with the present application after ink injection is described in the following.

Figure 5:
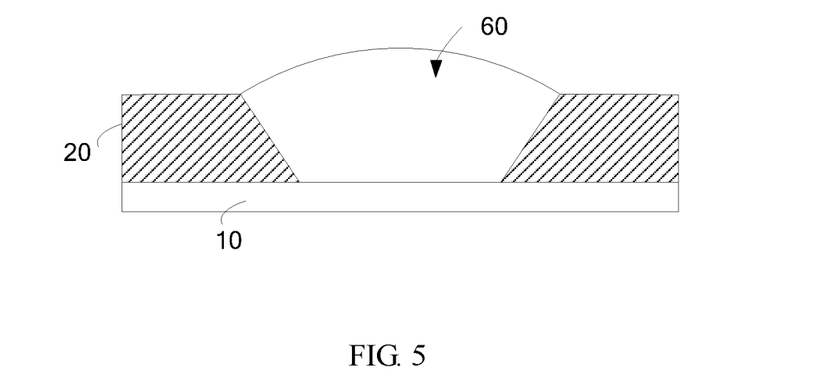
FIG. 5 is a sectional view showing a highest ink volume after ink injection in the prior art.
Figure 6:
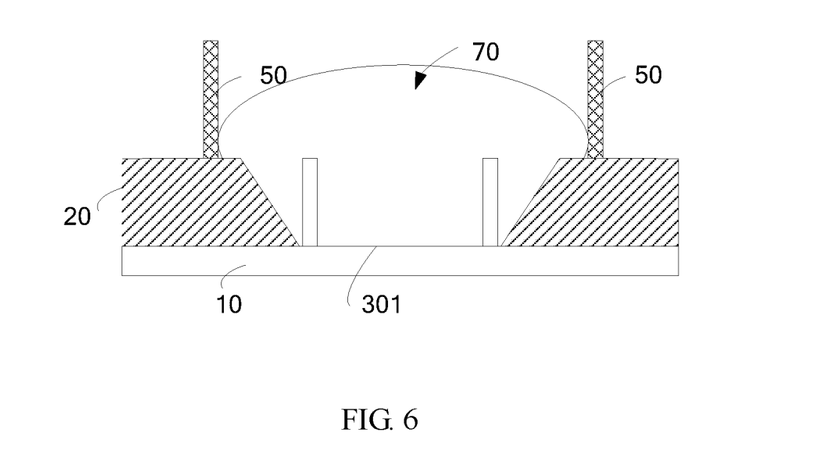
FIG. 6 is a sectional view showing a highest ink volume after ink injection by using the solution provided according to the embodiment of the present disclosure.

FIG. 5 is a schematic diagram showing a highest ink volume in the prior art. FIG. 6 is a schematic diagram showing a highest ink volume according to the embodiment of the present disclosure. As shown in FIG. 5, after ink injection, the highest ink volume held is the ink volume in the region 60, and after the increase of the hydrophobic inducing columns, as shown in FIG. 6, the highest ink volume held is the ink volume shown in region 70; it can be found that, after the addition of the hydrophobic inducing columns, the ink volume held increases; for high-resolution products, although the pixel area is reduced, by using the solution provided by the present application, the required ink volume still can be held.

Figure 7:
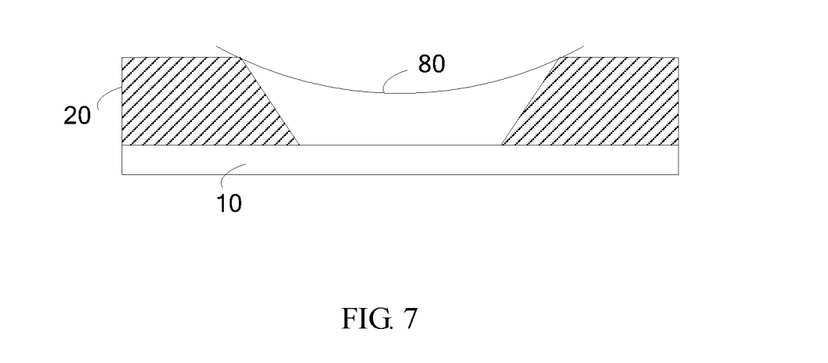
FIG. 7 is a sectional view showing the ink drying to the bank layer height after ink injection in the prior art.
Figure 8:
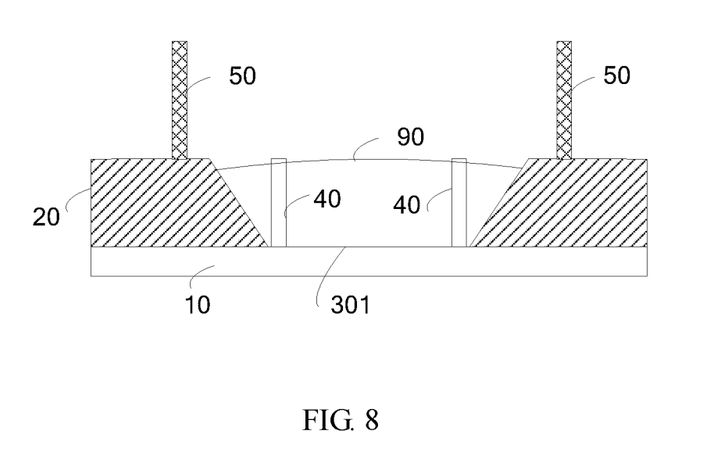
FIG. 8 is a sectional view showing the ink drying to the bank layer height after ink injection by using the solution provided according to the embodiment of the present disclosure.

FIG. 7 is a schematic diagram showing the ink surface when the ink dries to the pixel defining layer in the prior art. FIG. 8 is a schematic diagram showing the ink surface when the ink dries to the pixel defining layer by using the solution provided according to the embodiment of the present disclosure. As shown in FIG. 7, when the ink dries to the pixel defining layer 20, the ink surface is shown as the ink surface 80 in FIG. 7, and is a depressed area with inconsistent film thickness, resulting in uneven final film formation. By using the solution provided by the embodiment of the disclosure, as shown in FIG. 8, as a result of the addition of the hydrophilic inducing columns, when the ink dries to pixel defining layer 20, the hydrophilic inducing columns counteract partial surface tension; the ink surface is shown as the ink surface 90 in FIG. 8, and as compared with the ink surface 80 in FIG. 7, it is more flat, thereby making the final film formation more even. In addition, by changing the number and hydrophilicity of the hydrophilic inducing columns, the effect that the ink surface is planar can be reached. Therefore, by adopting the solution described in the embodiment of the disclosure, the final film formation thickness is comparatively consistent and uniformity of film formation is improved.

The embodiments of the present disclosure further provide a method of manufacturing the display substrate comprising:

providing a base substrate;

forming a pixel defining layer on the base substrate;

forming, in the pixel defining layer an opening region comprising a bottom wall and at least one sidewall;

forming, in the opening region, at least one hydrophilic inducing column at an edge of the bottom wall, wherein at least one of the hydrophilic inducing column has a hydrophilic surface.

In an alternative embodiment of the present disclosure, a plurality of hydrophilic inducing columns are formed, the bottom wall is of a regular shape, and the plurality of hydrophilic inducing column are provided symmetrically with respect to at least one symmetrical axis or a center of symmetry of the bottom wall.

In an example, positions of the plurality of hydrophilic inducing columns satisfy the following relation:

for a first position provided with a respective one of the plurality of hydrophilic inducing columns, a second position and a third position symmetrically with the first position are provided with respective ones of the hydrophilic inducing columns, wherein the symmetry is based on a symmetrical axis or a center of symmetry of the bottom wall.

In an alternative embodiment of the present disclosure, the opening region has a plurality of sidewalls, and the bottom wall has at least three sides connected by arcs at corners of the bottom wall in the opening region, a hydrophilic inducing column is formed at each corner of the bottom wall.

In an alternative embodiment of the present disclosure, a hydrophilic inducing column is formed at the position between two corners of the bottom wall near the sidewall.

In an alternative embodiment of the present disclosure, the at least one hydrophilic inducing column is of the same height as the opening region.

In an alternative embodiment of the present disclosure, the method further comprises forming at least one hydrophobic inducing column on an upper surface of the pixel defining layer near the at least one sidewall, wherein at least one of the hydrophobic inducing column has a hydrophobic surface.

In an alternative embodiment of the present disclosure, the opening region has a plurality of sidewalls, a plurality of hydrophobic inducing column are formed, and a respective one of the plurality of hydrophobic inducing column is formed on an upper surface of the pixel defining layer near a respective corner of the plurality of sidewalls.

In an alternative embodiment of the present disclosure, a plurality of hydrophobic inducing columns are formed, a region bounded by a boundary of the upper surface of the pixel defining layer with the at least one sidewall is of a regular shape, and the plurality of hydrophobic inducing columns are formed symmetrically with respect to at least one symmetrical axis or a center of symmetry of the region.

In an example, positions of the plurality of hydrophobic inducing columns satisfy the following relation:
for a fourth position provided with a respective one of the plurality of hydrophobic inducing columns, a fifth position and a sixth position symmetrically with the fourth position are provided with respective ones of the hydrophobic inducing columns, wherein the symmetry is based on a symmetrical axis or a center of symmetry of the region bounded by the boundary of the upper surface of the pixel defining layer with the sidewall.

In an alternative embodiment of the present disclosure, a hydrophobic inducing column is formed at the position between two corners on an upper surface of the pixel defining layer near the sidewall.

In an alternative embodiment of the present disclosure, the height of the hydrophobic inducing column is greater than the thickness of the pixel defining layer.

Although the embodiments revealed by the disclosure are described as above, they are implementations adopted only for the purpose of understanding the present disclosure and are not intended to limit the disclosure. Any person skilled in the art, without departing from the spirit and scope revealed by the disclosure, could make any modification and variation on the forms and details of the implementations, but the scope of patent protection of the disclosure still shall be determined by the scope defined in the attached claims.

What is claimed is:

1. An display substrate, comprising:
   a base substrate; and
   a pixel defining layer on the base substrate, wherein the pixel defining layer is provided with an opening region comprising a bottom wall and at least one sidewall, wherein in the opening region, an edge of the bottom wall is provided with at least one hydrophilic inducing column, wherein at least one of the hydrophilic inducing column has a hydrophilic surface.

2. The display substrate according to claim 1, wherein a plurality of hydrophilic inducing columns are provided, the bottom wall is of a regular shape, the plurality of hydrophilic inducing columns are provided symmetrically with respect to at least one symmetrical axis or a center of symmetry of the bottom wall.

3. The display substrate according to claim 1, wherein the opening region has a plurality of sidewalls, a plurality of hydrophilic inducing columns are provided, the bottom wall has at least three sides connected by arcs at corners of the bottom wall, each corner of the bottom wall is provided with a respective one of the plurality of hydrophilic inducing columns.

4. The display substrate according to claim 1, wherein the at least one hydrophilic inducing column is of the same height as the opening region.

5. The display substrate according to claim 1, wherein the at least one hydrophilic inducing column has a hydrophilicity greater than a hydrophilicity of the bottom wall.

6. The display substrate according to claim 1, wherein at least one hydrophobic inducing column is provided on an upper surface of the pixel defining layer near the at least one sidewall, wherein at least one of the hydrophobic inducing column has a hydrophobic surface.

7. The display substrate according to claim 6, wherein a plurality of hydrophobic inducing columns are provided, a region bounded by a boundary of the upper surface of the pixel defining layer with the at least one sidewall is of a regular shape, and the plurality of hydrophilic inducing columns are provided symmetrically with respect to at least one symmetrical axis or a center of symmetry of the region.

8. The display substrate according to claim 6, wherein the opening region has a plurality of sidewalls, a plurality of hydrophobic inducing columns are provided, and a respective one of the plurality of the hydrophobic inducing column is provided on the upper surface of the pixel defining layer near a respective corner of the plurality of sidewalls.

9. The display substrate according to claim 6, wherein a height of the at least one hydrophobic inducing column is greater than a thickness of the pixel defining layer.

10. The display substrate according to claim 6, wherein a plurality of hydrophobic inducing columns are provided, and the plurality of hydrophobic inducing columns are of the same height.

11. The display substrate according to claim 1, wherein a plurality of hydrophilic inducing columns are formed, the opening region has four sidewalls, the bottom wall has four sides connected by arcs at corners of the bottom wall, and a respective one of the plurality of hydrophilic inducing columns is provided at each corner of the bottom wall.

12. The display substrate according to claim 6, wherein the opening region has four sidewalls, a plurality of hydrophobic inducing columns are formed, and a respective one of the plurality of hydrophobic inducing columns is provided on the upper surface of the pixel defining layer near a respective corner of the four sidewalls.

13. A method of manufacturing an display substrate comprising:
   providing a base substrate;
   forming a pixel defining layer on the base substrate;
   forming in the pixel defining layer an opening region comprising a bottom wall and at least one sidewall;

forming, in the opening region, at least one hydrophilic inducing column at an edge of the bottom wall, wherein at least one of hydrophilic inducing column has a hydrophilic surface.

14. The method according to claim 13, wherein a plurality of hydrophilic inducing columns are formed, the bottom wall is of a regular shape, and forming, in the opening region, at least one hydrophilic inducing column at an edge of the bottom wall comprises forming the plurality of hydrophilic inducing columns symmetrically with respect to at least one symmetrical axis or a center of symmetry of the bottom wall.

15. The method according to claim 13, wherein the opening region has a plurality of sidewalls, a plurality of hydrophilic inducing columns are formed, the bottom wall has at least three sides connected by arcs at corners of the bottom wall, and forming, in the opening region, at least one hydrophilic inducing column at an edge of the bottom wall comprises forming a respective one of the plurality of hydrophilic inducing columns at each corner of the bottom wall.

16. The method according to claim 13, the method further comprising:
forming at least one hydrophobic inducing column on an upper surface of the pixel defining layer near the at least one sidewall, wherein at least one of the hydrophobic inducing column has a hydrophobic surface.

17. The method according to claim 16, wherein the opening region has a plurality of sidewalls, a plurality of hydrophobic inducing columns are formed, and forming at least one hydrophobic inducing column on an upper surface of the pixel defining layer near the at least one sidewall comprises forming a respective one of the plurality of hydrophobic inducing column on the upper surface of the pixel defining layer near a respective corner of the plurality of sidewalls.

18. The method according to claim 13, wherein a plurality of hydrophilic inducing columns are formed, the opening region has four sidewalls, and the bottom wall has four sides connected by areas at corners of the bottom wall, forming, in the opening region, at least one hydrophilic inducing column at an edge of the bottom wall comprises forming a respective one of the plurality of hydrophilic inducing columns at each corner of the bottom wall.

19. The method according to claim 16, wherein a plurality of hydrophobic inducing columns are formed, a region bounded by a boundary of the upper surface of the pixel defining layer with the at least one sidewall is of a regular shape, and forming at least one hydrophobic inducing column on an upper surface of the pixel defining layer near the at least one sidewall comprises forming the plurality of hydrophobic inducing columns symmetrically with respect to at least one symmetrical axis or a center of symmetry of the region.

20. The method according to claim 16, wherein the opening region has four sidewalls, a plurality of hydrophobic inducing columns are formed, and forming at least one hydrophobic inducing column on an upper surface of the pixel defining layer near the at least one sidewall comprises forming a respective one of the plurality of hydrophobic inducing columns on the upper surface of the pixel defining layer near a respective corner of the four sidewalls.

* * * * *